US007269009B2

(12) United States Patent
Ryu et al.

(10) Patent No.: US 7,269,009 B2
(45) Date of Patent: Sep. 11, 2007

(54) CASE FOR COVERING ELECTRONIC PARTS AND DISPLAY APPARATUS INCLUDING THE SAME

(75) Inventors: Ho-Chul Ryu, Seoul (KR); Sung-Won Bae, Cheonan (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/638,297

(22) Filed: Aug. 12, 2003

(65) Prior Publication Data

US 2004/0036819 A1 Feb. 26, 2004

(30) Foreign Application Priority Data

Aug. 26, 2002 (KR) ............... 10-2002-0050523

(51) Int. Cl.
*H05K 7/20* (2006.01)
*F28F 7/00* (2006.01)

(52) U.S. Cl. .................. 361/692; 361/687; 361/693; 454/184; 165/80.1

(58) Field of Classification Search ............. 361/689, 361/690, 692, 816, 818, 682, 683, 687, 724, 361/681, 688; 454/184, 42; 174/35 R; 165/80.1–80.3, 165/104.34
See application file for complete search history.

(56) References Cited

U.S. PATENT DOCUMENTS

| | | | | |
|---|---|---|---|---|
| 4,557,095 A * | 12/1985 | Rice et al. | ...................... | 52/473 |
| 4,716,493 A * | 12/1987 | Zelkowitz | ................... | 361/682 |
| 4,980,848 A * | 12/1990 | Griffin et al. | ................. | 361/687 |
| 5,928,076 A * | 7/1999 | Clements et al. | ............. | 454/184 |
| 6,043,979 A * | 3/2000 | Shim | .......................... | 361/695 |
| 6,081,425 A * | 6/2000 | Cheng | ......................... | 361/704 |
| 6,100,468 A * | 8/2000 | Niggl et al. | ................ | 174/52.1 |
| 6,104,451 A * | 8/2000 | Matsuoka et al. | ............ | 349/58 |
| 6,186,890 B1 * | 2/2001 | French et al. | ................ | 454/184 |
| 6,229,584 B1 | 5/2001 | Chuo et al. | | |
| 6,324,056 B1 * | 11/2001 | Breier et al. | ................ | 361/687 |
| 6,459,577 B1 * | 10/2002 | Holmes et al. | ............. | 361/690 |
| 6,597,569 B1 * | 7/2003 | Unrein | ......................... | 361/687 |
| 2002/0109969 A1* | 8/2002 | Wellhofer | .................... | 361/687 |
| 2003/0050002 A1* | 3/2003 | Pfister | ......................... | 454/184 |

FOREIGN PATENT DOCUMENTS

| | | |
|---|---|---|
| JP | 10-233979 | 9/1998 |
| JP | 11-119708 | 4/1999 |
| JP | 11-242442 | 9/1999 |
| JP | 2001-326488 | 11/2001 |
| JP | 2002-6757 | 1/2002 |
| JP | 2002-162910 | 6/2002 |
| JP | 2002-202730 | 7/2002 |

OTHER PUBLICATIONS

*ChineseOffice Action* issued by the Patent Office of the People's Republic of China in applicant's corresponding Chinese Patent Application No. 03132795.8.

* cited by examiner

*Primary Examiner*—Jayprakash Gandhi
*Assistant Examiner*—Zachary M Pape
(74) *Attorney, Agent, or Firm*—Robert E. Bushnell, Esq.

(57) ABSTRACT

A case for covering electronic parts and efficiently discharging heat generated from the electronic parts and a display apparatus including the case are provided. The case includes at least one partition wall partially separating at least an inner space of the case. An entry portion, through which air flows in, and an exit portion, through which the air having flowed in through the entry portion and then having absorbed heat from the electronic parts flows out, are formed in each plane of the case. Each plane is separated by the partition wall.

2 Claims, 16 Drawing Sheets

|   | P1 (°C) | P2 (°C) | P3 (°C) | P4 (°C) | P5 (°C) | P6 (°C) | P7 (°C) | P8 (°C) | P9 (°C) | P10 (°C) |
|---|---|---|---|---|---|---|---|---|---|---|
| ① | 51 | 59 | 57 | 61 | 69 | 70 | 51 | 49 | 50 | 47 |
| ② | 54 | 60 | 55 | 54 | 69 | 58 | 50 | 49 | 50 | 48 |
| ③ | 53 | 60 | 54 | 56 | 60 | 59 | 48 | 49 | 50 | 50 |
| ④ | 48 | 56 | 52 | 54 | 59 | 56 | 48 | 45 | 49 | 49 |

FIG. 13C

|   | R1 (°C) | R2 (°C) | R3 (°C) | R4 (°C) | R5 (°C) |
|---|---|---|---|---|---|
| ① | 48 | 53 | 60 | 46 | 46 |
| ② | 48 | 50 | 54 | 45 | 45 |
| ③ | 50 | 50 | 54 | 44 | 45 |
| ④ | 48 | 47 | 51 | 42 | 43 |

CASE FOR COVERING ELECTRONIC PARTS AND DISPLAY APPARATUS INCLUDING THE SAME

CLAIM OF PRIORITY

This application claims the is incorporated herein in its entirety by reference. This application makes reference to, incorporates the same herein, and claims all benefits accruing under 35 U.S.C. §119 from Korean Patent Application No. 2002-50523, filed on Aug. 26, 2002.

BACKGROUND OF THE INVENTION

1. Field of the Invention

The present invention relates to a case for covering electronic parts and a display apparatus including the same, and more particularly, to a case having a structure for improving the radiation of heat generated from electronic parts, and a display apparatus including the same.

2. Description of the Related Art

In an electronic device such as in a display apparatus, the electronic components generate a large amount of heat. It is important to dissipate this heat in an efficient manner so that the electronic components do not overheat. Often, space is too cramped to have a fan. Fans are also expensive and draw more power. Therefore, a perforated rear cover is formed on a back of an electronic device. The perforations allow cool air to enter and hot air to leave the electronic device.

In an essentially two dimensional device such as an LCD or plasma display, keeping the electronic components within the device cool is a major problem. Especially in today's display devices, where the display is large, heat dissipation is critical. Holes are formed in the rear cover of the display to dissipate the generated heat. Cool air from the outside enters, via the perforations, to cool the electronic parts. As a consequence, this air is heated and rises within the device. Then, the heated air exits the electronic device though other perforations. What is needed is a design for a rear cover for an electronic device like a display, that efficiently draws heat away from the electronic components and thus keeps the electronic components at a cool temperature.

SUMMARY OF THE INVENTION

It is therefore an object of the present invention to provide an improved rear cover design for an electronic device, such as a display apparatus.

It is further an object of the present invention to provide a design for a rear cover of an electronic device such as a display panel that allows for a more efficient heat dissipation and that keeps electronic components within the electronic device at a cooler temperature during operation.

It is also an object to prevent air heated by one electrical component from reaching another electronic component within the electronic device so that each electronic component is cooled by cool air instead of being in contact with air heated by another electronic component.

It is further an object of the present invention to provide a design for a rear cover that more efficiently draws heat away from the electronic components without using a fan.

These and other objects can be achieved by a rear cover design with at least four groups of perforations. Two of these groups of perforations serve to allow cool air from the outside of the electronic device to enter the space between the rear cover and the electronic components. The other two groups of perforations are to allow air warmed by the electronic components to leave the electronic device in an efficient manner so that the already heated air does not again come into contact with additional electronic components. These objects are achieved by having a partition or barrier formed on an inside side of a rear cover to divide the space between the rear cover and the electronic components into two separate groups. On each side of the partition are two groups of perforations, one for air entry and one for air exit. Such a design prevents air heated by electrical components on one side of the partition to later come into contact with air on the other side of the partition.

Other design features for the rear cover may include one or more of the following: 1) having one of the partitions forming an acute or obtuse angle with the rear cover to better and more efficiently draw air heated by electrical components away from the electronic device as the heated air rises within the device, 2) provide a mesh for certain groups of perforations in the rear cover to increase the amount of holes and open areas in the rear cover to more efficiently draw heated air away from the electronic device with less resistance and thus more efficiently cool the electronic device, 3) to have one of the groups of perforations in the rear cover disposed on a top edge of the rear cover part to more efficiently dispel rising heated air away from the electronic device, 4) to have an indented portion of the rear cover with a floor piece extending inward towards the electronic components, the floor piece having perforations to let warm rising air to escape from the electronic device.

The partition wall may be horizontally disposed to separate the inner space into an upper space and a lower space or a left space and a right space. When the partition wall separates the inner space into the upper space and the lower space, it is preferable that a first exit portion below the partition wall is formed in an upper most area of a lower rear plane defining the lower space separated by the partition wall, and a second exit portion above the partition wall is formed in an upper most area of an upper rear plane defining the upper space separated by the partition wall. In addition, it is preferable that the first exit portion is formed on a level formed by the rear plane, and the partition wall forms an acute angle with the first exit portion.

Alternately, the partition may be horizontally disposed to separate the inner space into left and right portions. Each portion has one group of perforations that serve as air entry holes and another group of perforations that serve as air exit holes.

Preferably, entry holes having a width of 1-8 mm are formed in the entry portion, and exit holes having a width of 1-8 mm are formed in the exit portion. Preferably, the entry holes and the exit holes are formed in a predetermined pattern, and at least some of the entry holes and the exit holes are defined by a mesh to reduce air resistance. More preferably, the mesh is integrally formed with a rear cover of the case.

Furthermore, groups of perforations are staggered in a horizontal direction to prevent hot air exiting from one group of perforations from reentering the electronic device at another group of entry perforations.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 13C is a table showing the empirical results of temperature measurements at points R1 through R5 illustrated in FIG. 13A;

DETAILED DESCRIPTION OF THE INVENTION

Figure 1:
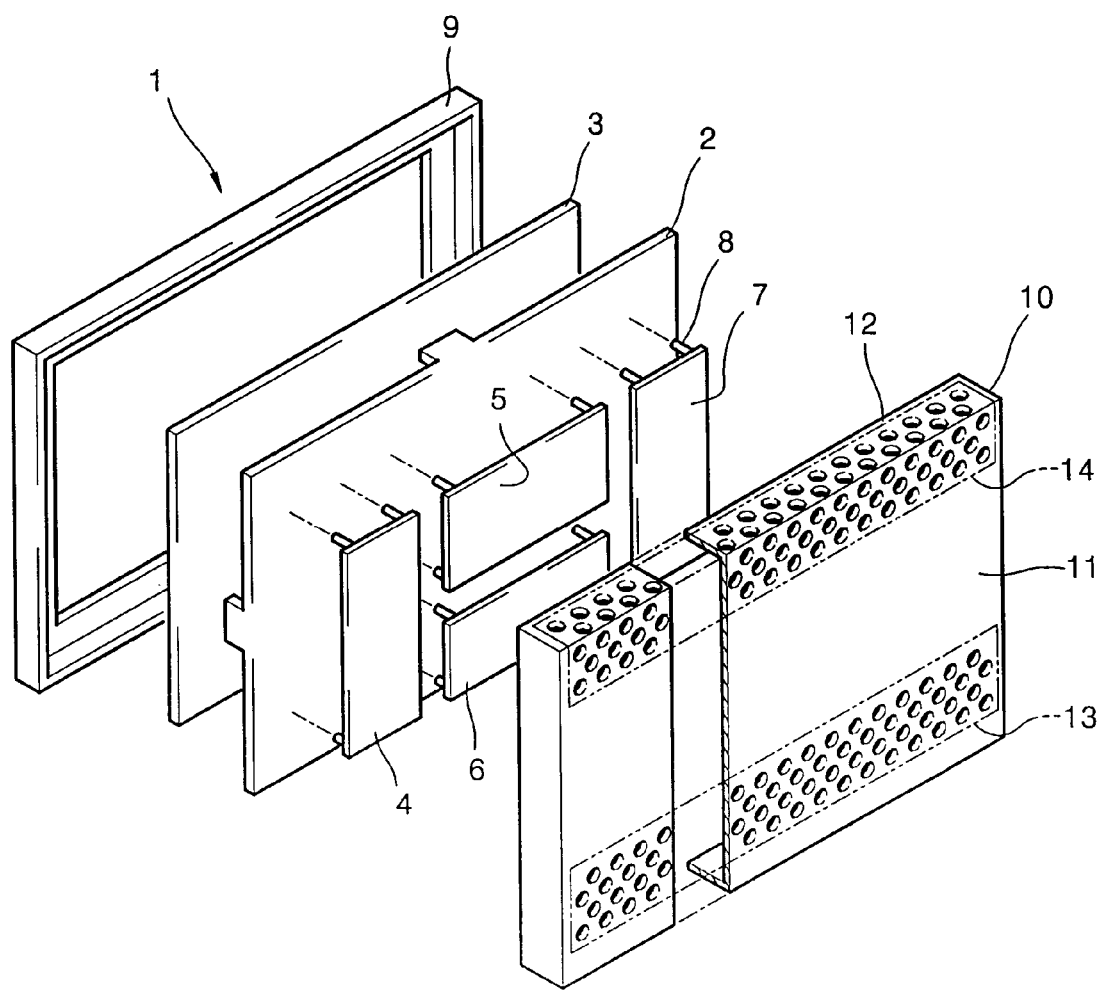
FIG. 1 is an exploded perspective view of a display apparatus including a case for covering electronic parts.

Turning to the figures, a display apparatus 1 illustrated in FIG. 1 includes a case composed of a front cover 9 and a rear cover 10; a frame 2 disposed within the case; and electronic parts, i.e., a display panel 3 installed in front of the frame 2, a left circuit board 4, an upper circuit board 5, a lower circuit board 6, and a right circuit board 7, which are installed on the back of the frame 2 using spacers 8. The electronic parts and accompanying parts installed within the case are schematically illustrated or omitted. A rear plane 11 of the rear cover 10 is flat as a whole and has an entry portion 13 at its lower area. An exit portion 14, through which air entered through the entry portion 13 flows out, is formed in the upper area of the rear plane 11 and a top plane 12 of the rear cover 10.

Figure 2:
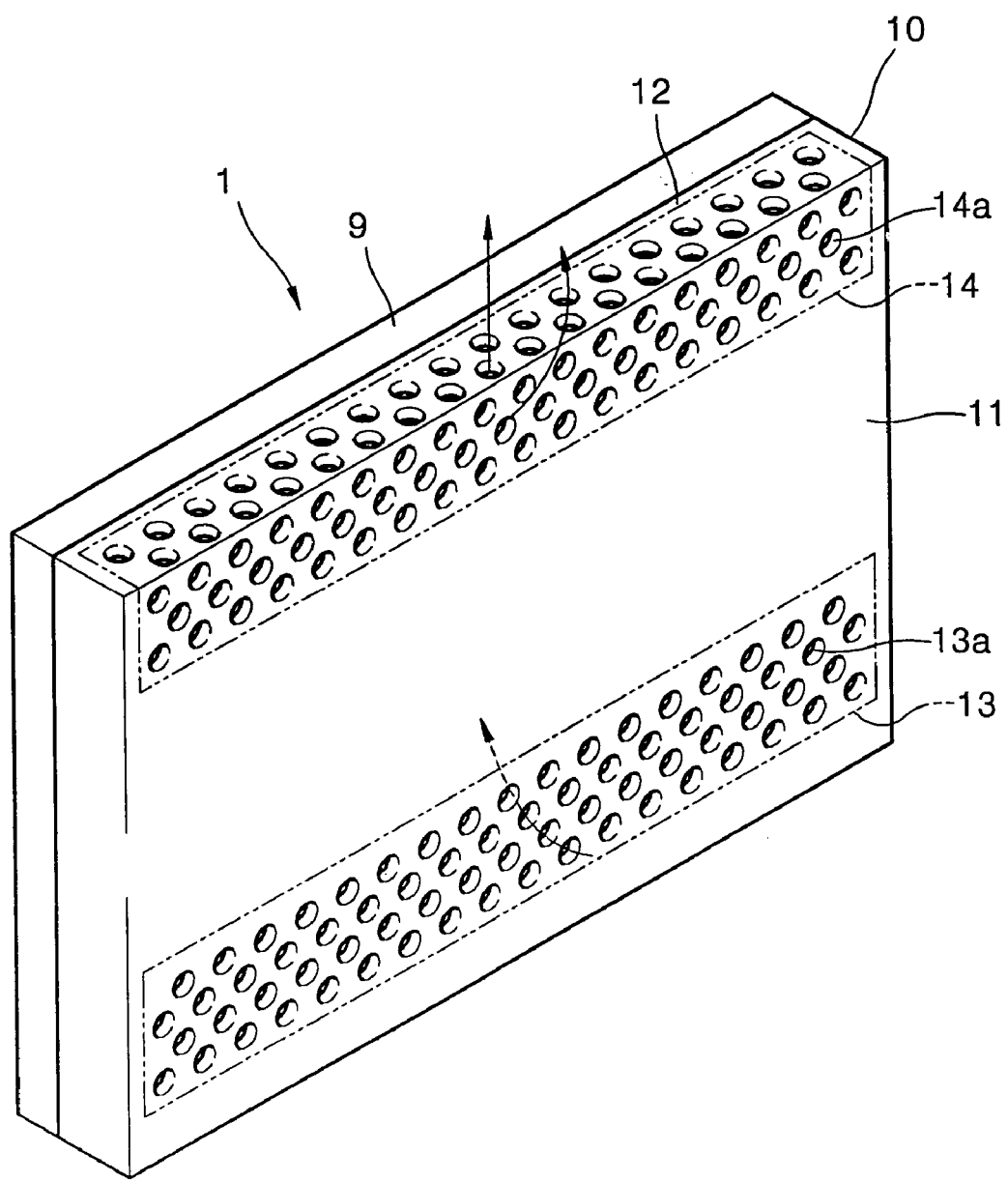
FIG. 2 is a perspective view of the display apparatus illustrated in FIG. 1 after being assembled and illustrates the direction of an air flow.

FIG. 2 illustrates the display apparatus 1 after being assembled. As illustrated in FIG. 2, air flows in through the entry portion 13 and becomes lighter than ambient air by absorbing heat from the electronic parts, thereby flowing out through the exit portion 14.

One problem with the configuration of FIGS. 1 and 2 is that air heated by the lower circuit board 6 then impinges on the upper circuit board 5 thus denying upper circuit board 5 to be cooled by cool ambient air. Therefore, a partition in the rear cover 10 that extends horizontally between the lower circuit board 6 and the upper circuit board 5 is needed to prevent the already warmed air from contacting upper circuit board 5. In addition, another two groups of perforations are needed in the rear cover 10 to 1) expel the air heated by lower circuit board 6 and to 2) allow cool ambient air to enter the device to cool upper circuit board 6.

Figure 3:
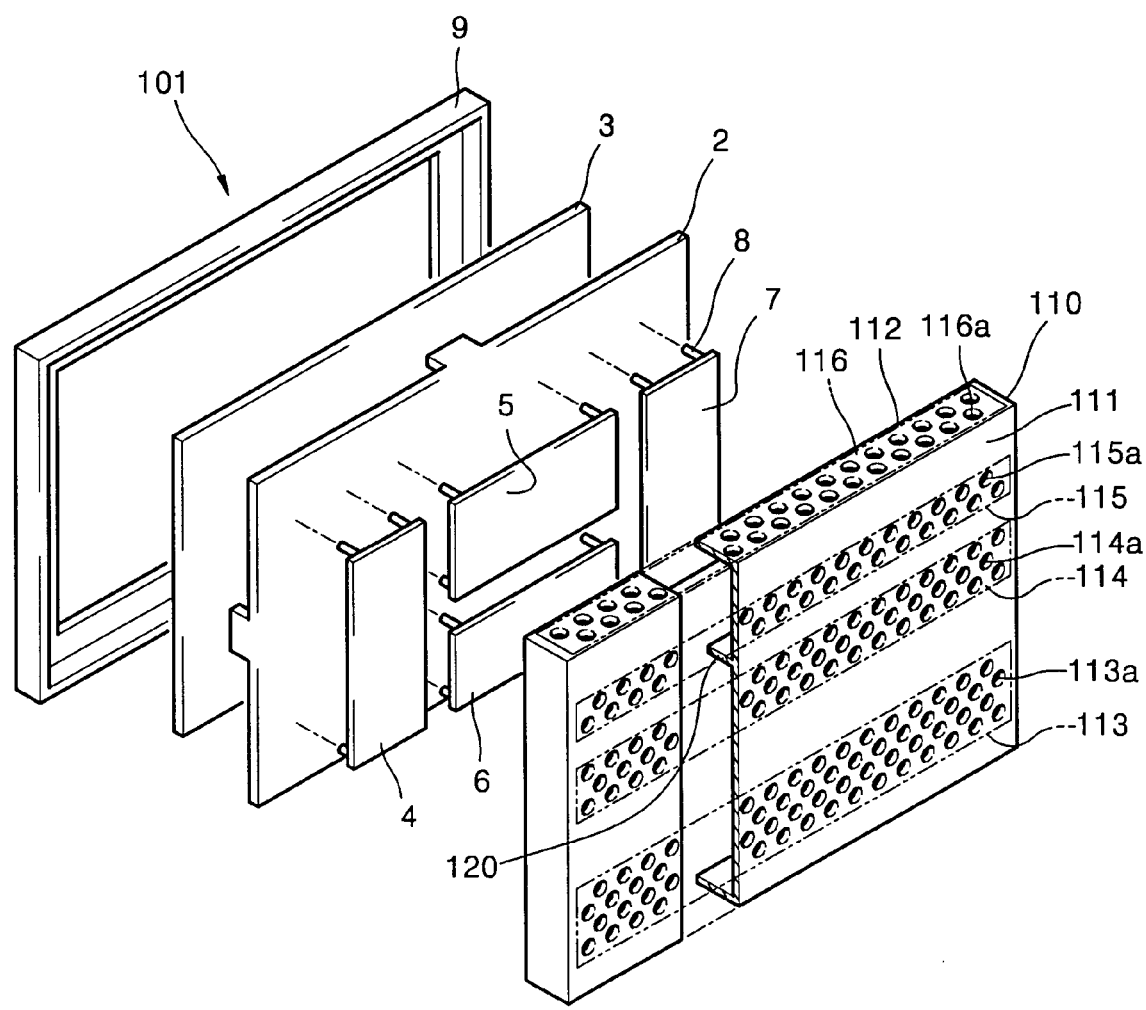
FIG. 3 is an exploded perspective view of a display apparatus including a case for covering electronic parts according to a first embodiment of the present invention.

Turning to FIG. 3, FIG. 3 illustrates an exploded perspective view of a display apparatus 101 including a case for covering electronic parts according to a first embodiment of the present invention. 3. For clarity of the description, it is assumed that the case covers a display panel 3 and accompanying parts. In FIG. 3, the display panel 3 and the accompanying parts are schematically illustrated and some other electronic parts are omitted for clarity.

The display apparatus 101 includes the display panel 3; the circuit boards 4, 5, 6, and 7 driving the display panel 3, the frame 2 supporting the display panel 3 and the circuit boards 4, 5, 6, and 7, the spacers 8 supporting the circuit boards 4, 5, 6, and 7 on the frame 2 and the front cover 9 and a rear cover 110, which constitute a case for covering the above members.

The display panel 3 displays an image which a user can view and may be a front panel of a cathode-ray tube (CRT), a liquid crystal display (LCD) panel, an electroluminescent display panel, a plasma display panel (PDP), a light emitting diode (LED) display panel, or the like. In particular, a PDP radiates a lot of heat, and thus heat radiation must be significantly considered in designing the case.

The circuit boards 4 through 7 can be manufactured in various shapes, but in the embodiments of the present invention, they are composed of the left circuit board 4, the upper circuit board 5, the lower circuit board 6, and the right circuit board 7 which are defined depending on their positions. Alternatively, only a single circuit board can be used. The circuit boards 4 through 7 include a power supply unit, an image driving unit, and a control unit, which are necessary to drive the display panel 3 and wires connecting the units. It is preferable that the structure of a case for covering electronic parts is determined depending on the positions of the circuit boards 4 through 7 and the heat radiation characteristics of the units installed on the circuit boards 4 through 7. That is, it is preferable to optimize the structure of the case in accordance with the amount of heat radiated from each unit and the heat resistance characteristic of each unit.

When heat generated from the circuit boards 4 through 7 and the display panel 3 is not efficiently discharged, the operation of the display panel 3 is endangered by the heat. Accordingly, it is preferable that the circuit boards 4 through 7 are disposed to be separated from the display panel 3 so that air can flow therebetween. In order to separate them, the spacers 8 support the circuit boards 4 through 7 to be separated from the frame 2 by a predetermined distance.

The frame 2 supports the display panel 3 and the circuit boards 4 through 7. In the first embodiment, the display panel 3 is directly supported by the frame 2, and the circuit boards 4 through 7 are indirectly supported by the frame 2 using the spacers 8. However, conversely, the frame 2 can directly support the circuit boards 4 through 7 and indirectly support the display panel 3 using the spacers 8. The frame 2 may have legs (not illustrated) for supporting the display apparatus 101 or a hook or hole (not illustrated) for hanging the display apparatus 101 on the wall.

The case covers the display panel 3, the circuit boards 4 through 7, the frame 2, and the spacers 8. In the first embodiment, the case is composed of the front cover 9 covering the front side of the display panel 3 and the rear cover 110 covering the rear of the circuit boards 4 through 7. However, the case may be composed of a hexagonal body having one opening, through which parts may be installed, and a cover for covering the opening. A window through which light can be transmitted is formed on the front side of the case, which corresponds to the front side of the display panel 3.

A rear plane 111 of the rear cover 110 includes a first entry portion 113 formed in a lower area, a first exit portion 114 formed above the first entry portion 113, a partition wall 120 formed on an inner surface right above the first exit portion 114 to separate an inner space defined by the rear cover 110 into an upper space and a lower space, and a second entry portion 115 formed right above the partition wall 120. A top plane 112 of the rear cover 110 includes a second exit portion 116. The second exit portion 116 maybe formed in an upper most area of the rear plane 111 or from the upper most area of the rear plane 111 to the top plane 112. In this description, the term "entry portion" are a group of perforations in the rear cover that serve to let cool ambient air enter the display device from the outside. The term "exit portion" refers to a group of perforations that serve to expel heated air from an inside of the display to an outside.

Entry holes 113*a* and 115*a* and exit holes 114*a* and 116*a* are formed in the first entry portion 113, the first exit portion 114, the second entry portion 115, and the second exit portion 116 in order to allow air to flow in and out of the case. It is preferable that the entry holes 113*a* and 115*a* and exit holes 114*a* and 116*a* have shapes and sizes maximizing the flow of air, insofar as the structural strength of the rear cover 110 is guaranteed. Their shapes may be a circle, a rectangle, a diamond, a triangle, and a hexagon. Their sizes are preferably set to enable air to flow as well as possible. Their sizes are determined to be small enough not to allow children's fingers to pass therethrough. Usually, the width of the entry holes 113*a* and 115*a* and exit holes 114*a* and 116*a* satisfying the above conditions is about 1-8 mm. An opening ratio of the first and second exit portions 114 and 116 and the first and second entry portions 113 and 115 is about 25%. In other words, in the vicinity of a group of perforations, about 25% of the surface area is perforations and the remaining 75% are solid portions of the rear cover between perforations. In the case of the first or second exit portion 114 or 116, an opening ratio indicates a ratio of a total of areas of exit holes 114*a* or 116*a* to the entire area of the first or second exit portion 114 or 116. In the case of the first or second entry portion 113 or 115, an opening ratio indicates a ratio of a total of areas of entry holes 113*a* or 115*a* to the entire area of the first or second entry portion 113 or 115.

The partition wall 120 is formed on the inner surface of the rear cover 110 between the first exit portion 114 and the second entry portion 115 to separate the inner space of the case into the upper space and the lower space so that air flows out through the first exit portion 114. The partition wall 120 may be continuously formed throughout the inner surface of the rear plane 111 in a lengthwise direction but is not restricted thereto. In particular, when a certain part contained in the cover has a large size in a vertical direction, the partition wall 120 may be lowered or discontinued at a portion corresponding to the certain part. That is, the height of the partition wall 120 may vary in the lengthwise direction to accommodate various circuit parts or circuit boards. In addition, the partition wall 120 may be formed in a straight line in the lengthwise direction but may be formed to go round such a large part as describe above. In other words, the partition wall 120 may be folded or curved. Usually, it is preferable that air in the spaces separated by the partition wall 120 do not communicate with each other. Accordingly, it is preferable that the partition wall 120 is in close contact with the circuit boards 4 through 7 and electronic parts installed on the circuit boards 4 through 7.

Figure 4:
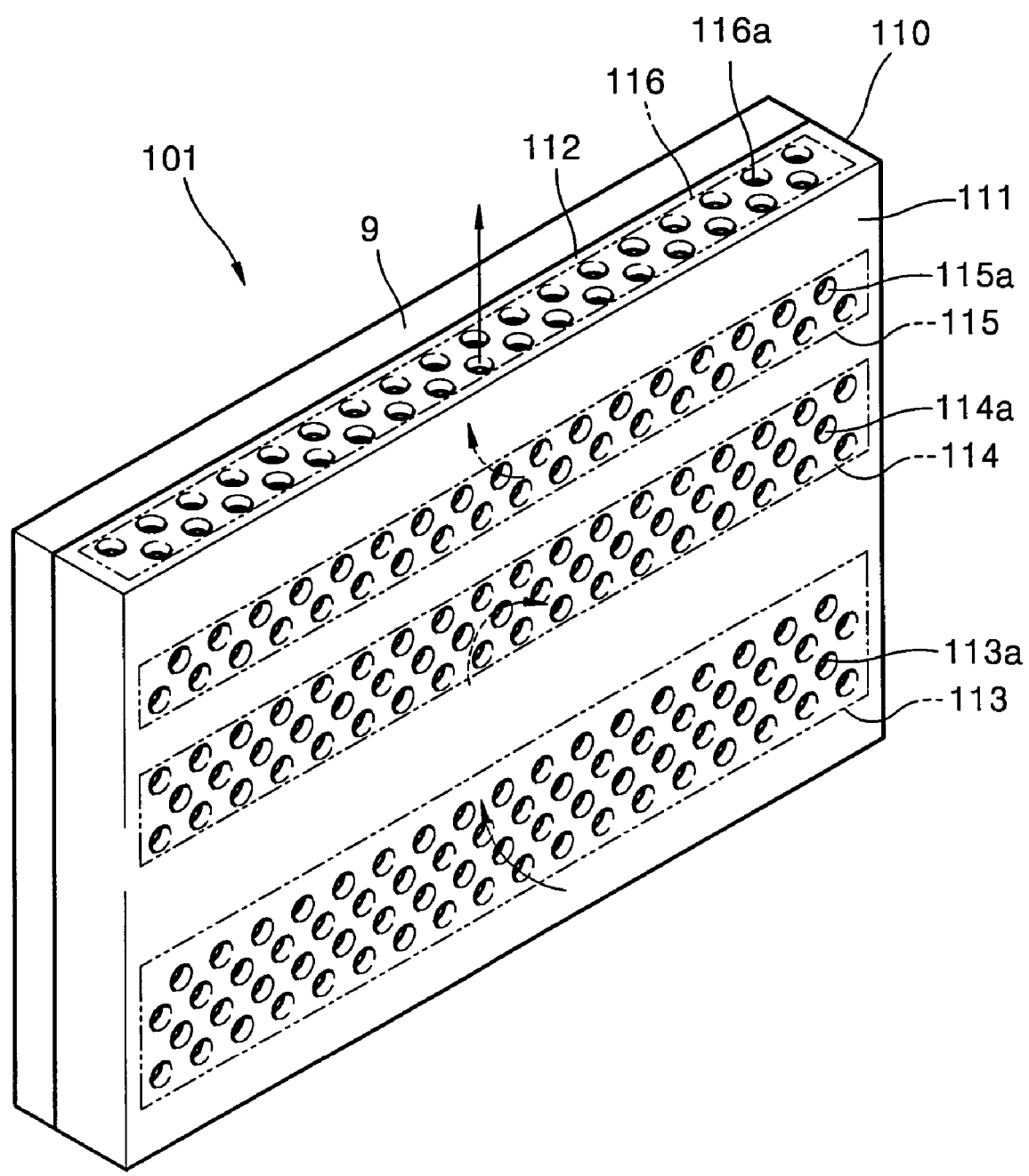
FIG. 4 is a perspective view of the display apparatus illustrated in FIG. 3 after being assembled and illustrates the direction of an air flow.

Inflow and outflow of air through the entry portions 113 and 115 and the exit portion 114 and 116 of the case will be described with reference to FIG. 4. As illustrated in FIG. 4, the arrows indicate that air flows in through the first entry portion 113, absorbs heat from electronic parts in the lower space, and is guided by the partition wall 120 to flow out through the first exit portion 114. Air flowing in through the second entry portion 115 absorbs heat from electronic parts in the upper space and flows out through the second exit portion 116.

The above described air flow can be accomplished due to the effect of natural convection. In natural convection, air flows in and out due to heat generated from the electronic parts. In other words, air having absorbed heat from the electronic parts expands and becomes light, and thus goes up and naturally flows out through the exit portions 114 and 116 respectively formed above the entry portions 113 and 115. Then, external air flows in through the entry portions 113 and 115 to occupy the space previously filled in by the discharged air.

In the meantime, in order to make air flow more efficiently in and out, a fan may be installed to assist natural convection. In this case, it is preferable to blow an air current in the same direction as the natural air flow. A fan may be installed in one of the spaces separated by the partition wall. Although a fan may be employed, a case having the structure as described in the first embodiment is less dependent on the fan, and thus manufacturing cost for the fan and electric power necessary for operating the fan can be reduced.

In particular, in the case where the display panel 3 is a high-resolution PDP, it is preferable to separate a screen into an upper area and a lower area and to separately drive the upper and lower areas. In this case, it is usual to respectively install image driving integrated circuit chips (directly installed on the rear of the PDP) for controlling the PDP in the upper and lower portions of the PDP. Such an integrated circuit chip radiates a particularly large amount of heat, and thus if air having absorbed heat from a lower integrated circuit chip goes up in the case, an upper integrated circuit chip cannot satisfactorily radiate heat, which badly affects a display apparatus. By separating the inner space of a display apparatus into two spaces using a partition wall and forming entry portions and exit portions in each of the two spaces, as described in the first embodiment, the above problems can be solved. In other words, with the arrangement of the first embodiment, air heated by a lower integrated circuit chip is not used to cool an upper integrated circuit chip. Instead, new cool air of ambient temperature is drawn in to cool the upper integrated circuit chip in the first embodiment.

Figure 5:
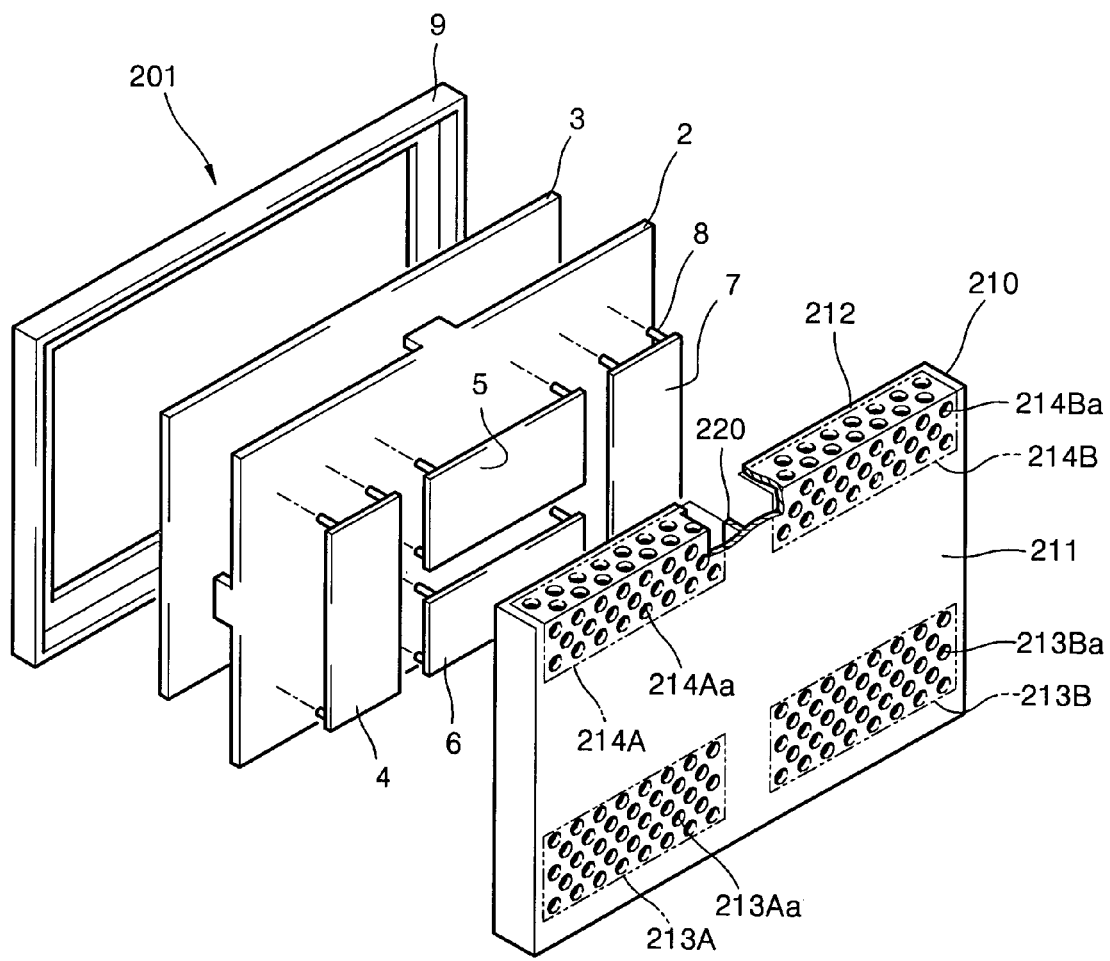
FIG. 5 is an exploded perspective view of a display apparatus including a case for covering electronic parts according to a second embodiment of the present invention.

An exploded perspective view of a display apparatus 201 including a case for covering electronic parts according to a second embodiment of the present invention is illustrated in FIG. 5. Hereinafter, the features of the second embodiment different from the first embodiment will be described. A rear plane 211 of a rear cover 210 in the display apparatus 201 includes a partition wall 220 separating the inner space defined by the rear cover 210 into a left space and a right space, a left entry portion 213A formed in a lower portion of an area defining the left space, a left exit portion 214A formed above the left entry portion 213A, a right entry portion 213B formed in a lower portion of an area defining the right space, and a right exit portion 214B formed above the right entry portion 213B. The exit portions 214A and 214B may be formed in the upper portion of the rear plane 211 or from the upper most portion of the rear plane 211 to a top plane 212. The fact that exit holes are formed on a top plane 212 of rear cover 210 and not on the rear plane 211 enables rising hot air to easily escape from the display apparatus 201 with little or no resistance. Entry holes 213A$a$ and 213B$a$, which are the same as the entry holes of the first embodiment, are formed in the entry portions 213A and 213B. Exit holes 214A$a$ and 214B$a$, which are the same as the exit holes of the first embodiment, are formed in the exit portions 214A and 214B.

The partition wall 220 separates the inner space of the case into the left and right spaces and thus guides air flowing in through the left entry portion 213A toward the left exit portion 214A and air flowing in through the right entry portion 213B toward the right exit portion 214B. In addition, the partition wall 220 provides an efficient heat protection for electronic parts having low heat resistance in a case where electronic parts installed in the left and right portions within the case have different thermal characteristics.

Figure 6:
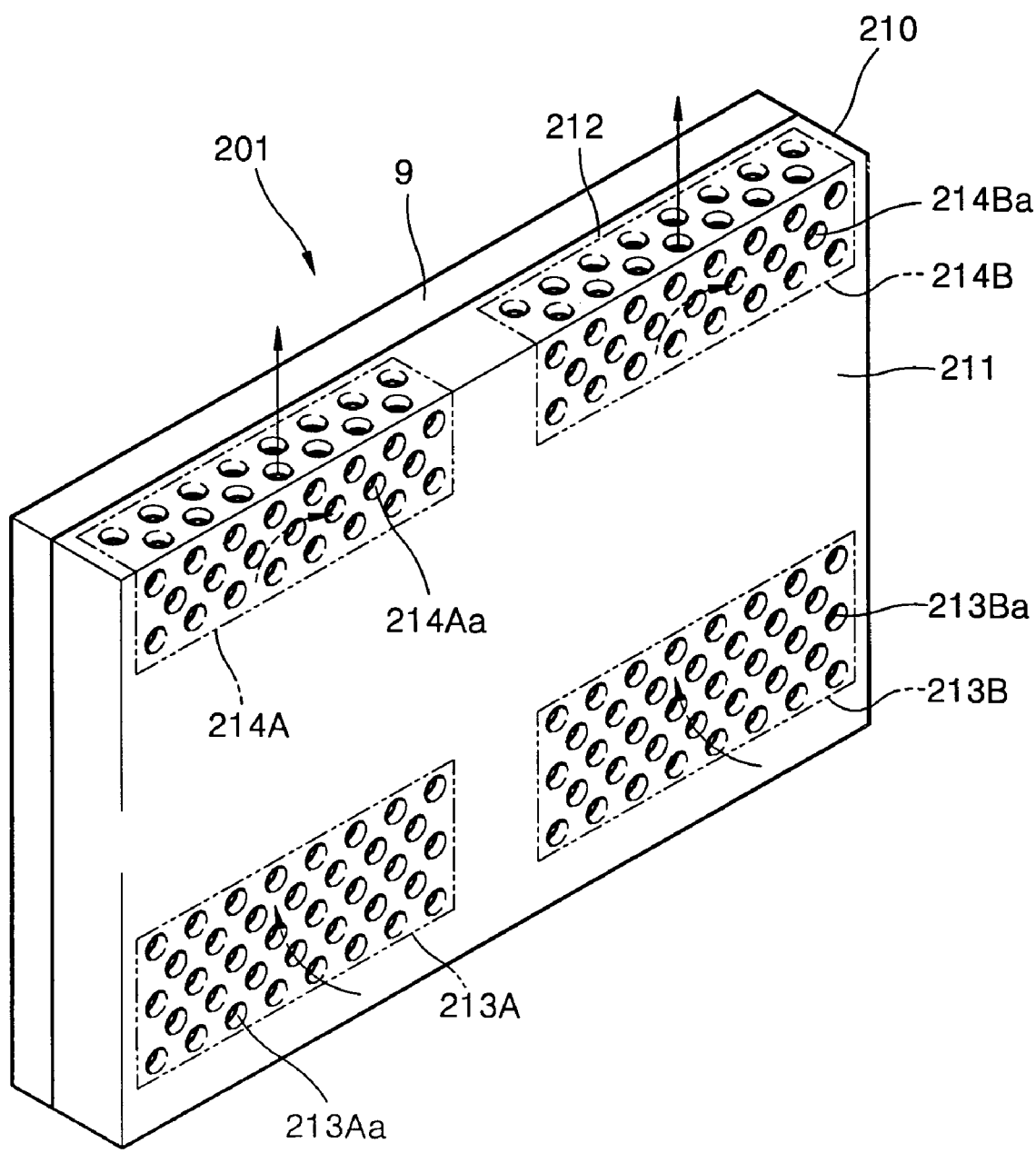
FIG. 6 is a perspective view of the display apparatus illustrated in FIG. 5 after being assembled and illustrates the direction of an air flow.

As illustrated by the arrows in FIG. 6, air flows in through the left and right entry portions 213A and 213B, absorbs heat from electronic parts, and flows out through the left and right exit portions 214A and 214B, separately. In the second embodiment, the inner space defined by the case is vertically separated into two spaces by the partition wall 220 but may be separated into three or more spaces. Thus, if left circuit board 4 generates an enormous amount of heat and right circuit board 7 generates a relatively small amount of heat, the air heated by left circuit board cannot reach the right circuit board 7 because of partition 220. Therefore, right circuit board 7 receives cool air of ambient temperature through right entry portion 213B and the cooling of right circuit board 7 is not compromised by the enormous amount of heat generated by left circuit board 4.

Figure 7:
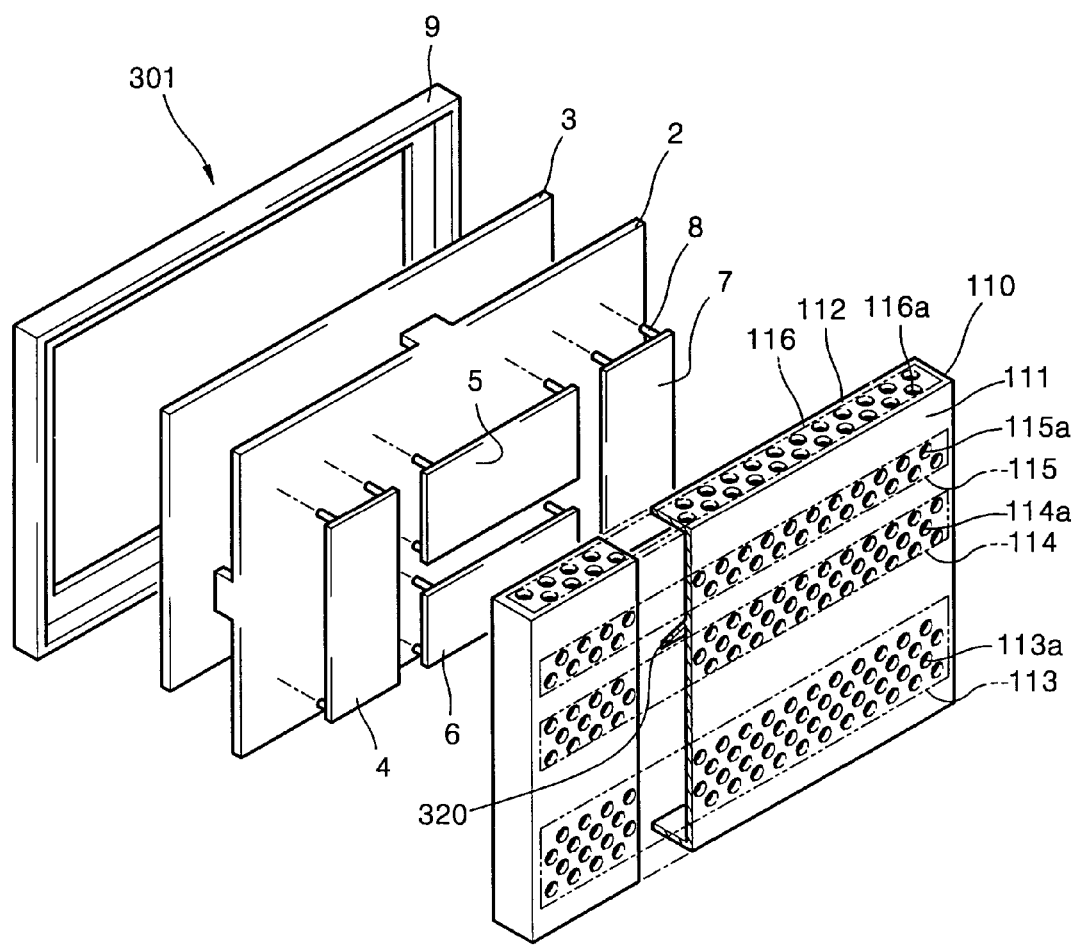
FIG. 7 is an exploded perspective view of a display apparatus including a case for covering electronic parts according to a third embodiment of the present invention.

An exploded perspective view of a display apparatus 301 including a case for covering electronic parts according to a third embodiment of the present invention is illustrated in FIG. 7. Hereinafter, the features of the third embodiment different from the first embodiment will be described.

The rear plane 111 of the rear cover 110 in the display apparatus 301 includes the first entry portion 113 formed in the lower area, the first exit portion 114 formed above the first entry portion 113, a partition wall 320 transversely formed right above the first exit portion 114 on the inner surface of the rear plane 111 to be inclined at an acute angle with respect to the first exit portion 114 so as to separate the inner space defined by the rear cover 110 into an upper space and a lower space, and the second entry portion 115 formed right above the partition wall 320. The top plane 112 of the rear cover 110 includes the second exit portion 116. The second exit portion 116 may be formed in the upper most area of the rear plane 111 or from the upper most area of the rear plane 111 to the top plane 112.

The entry holes 113$a$ and 115$a$ and the exit holes 114$a$ and 116$a$ are formed in the first entry portion 113, the first exit portion 114, the second entry portion 115, and the second exit portion 116, and the shapes and the sizes thereof are determined in the same manner as those of the first embodiment. The third embodiment is different from the first embodiment in that the partition wall 320 is inclined so as to face the first exit portion 114. Since the partition wall 120 of the first embodiment is not inclined like this, air moving upward is stagnated below the partition wall 120 in the first embodiment for a while before flowing out through the first exit portion 114. However, in the third embodiment, since the partition wall 320 is inclined to face the first exit portion 114, air having absorbed heat from electronic parts efficiently flows out along the inclined partition wall 320. The direction of an air flow in the third embodiment is the same as that in the first embodiment.

Figure 8:
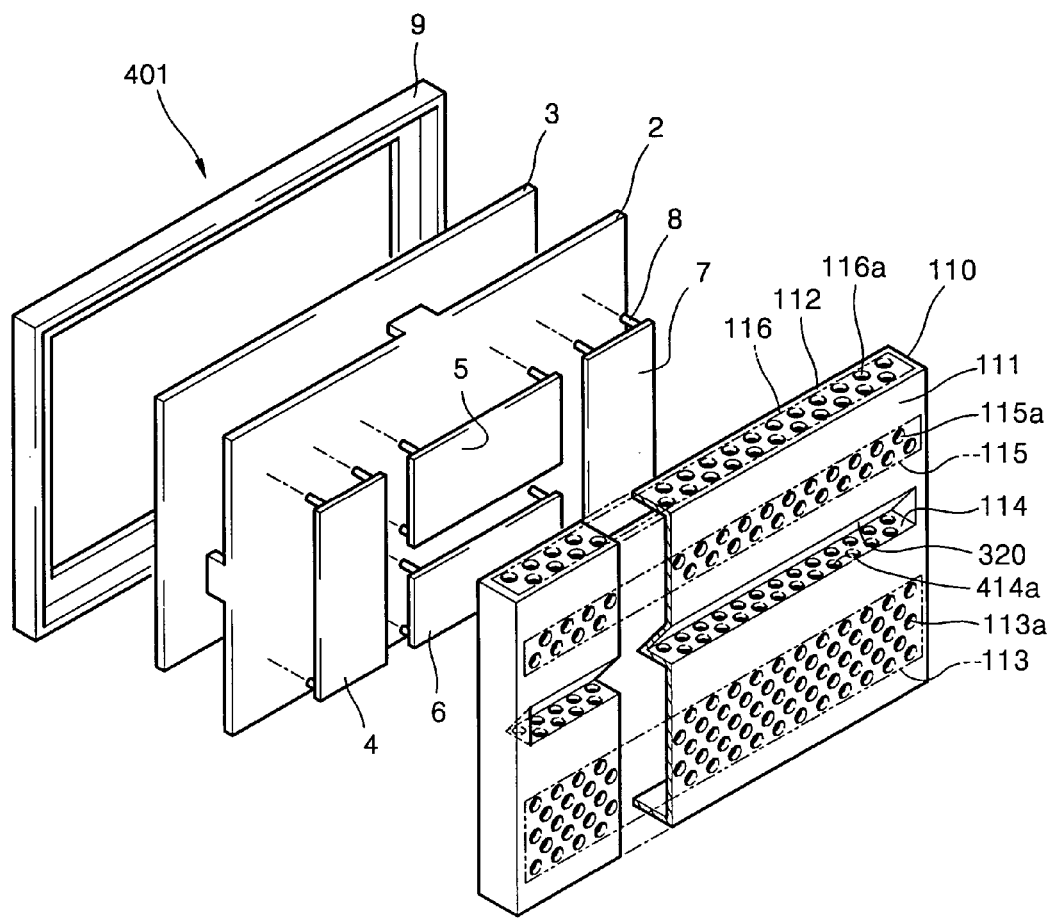
FIG. 8 is an exploded perspective view of a display apparatus including a case for covering electronic parts according to a fourth embodiment of the present invention.

An exploded perspective view of a display apparatus 401 including a case for covering electronic parts according to a fourth embodiment of the present invention is illustrated in FIG. 8. The fourth embodiment is different from the third embodiment in that the first exit portion 114 is indented to be formed to be perpendicular to the rear plane 111 of the rear cover 110 so that exit holes 414$a$ formed in the first exit portion 114 face upward. This structure increases the structural strength of the rear cover 110. The direction of an air flow in the case according to the fourth embodiment is the same as in the third embodiment.

Figure 9:
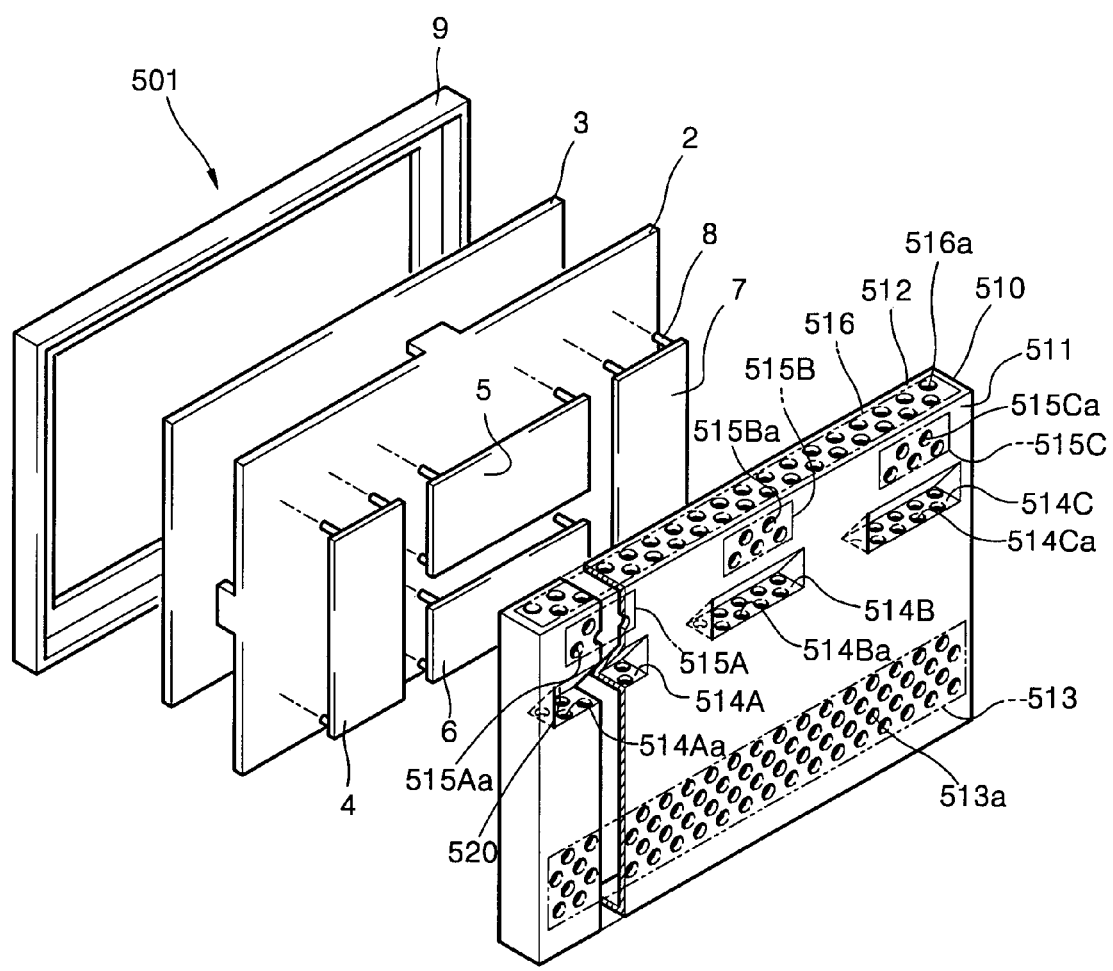
FIG. 9 is an exploded perspective view of a display apparatus including a case for covering electronic parts according to a fifth embodiment of the present invention.

An exploded perspective view of a display apparatus 501 including a case for covering electronic parts according to a fifth embodiment of the present invention is illustrated in FIG. 9. A rear plane 511 of a rear cover 510 in the display apparatus 501 includes a first entry portion 513 formed in a lower portion; first exit portions 514A, 514B, and 514C formed above the first entry portion 513; a partition wall 520 transversely formed right above the first exit portions 514A, 514B, and 514C to separate the inner space defined by the rear cover 510 into an upper space and a lower space, and second entry portions 515A, 515B, and 515C formed right above the partition wall 520. A top plane 512 of the rear cover 510 includes a second exit portion 516. The second exit portion 516 may be formed in the upper most portion of the rear plane 511 or from the upper most portion of the rear plane 511 to the top plane 512. The first exit portions 514A, 514B, and 514C and the second entry portions 515A, 515B, and 515C are not continuous as in the fourth embodiment. The break in continuity in this fifth embodiment is to accommodate for the presence of circuit components on frame 2.

Entry holes 513$a$, 515A$a$, 515B$a$, and 515C$a$ and exit holes 514A$a$, 514B$a$, 514C$a$, and 516$a$ are formed in the first entry portion 513, the first exit portions 514A, 514B, and 514C, the second entry portions 515A, 515B, and 515C, and the second exit portion 516 in order to allow air to flow in and out of the case. It is preferable that the entry holes 513$a$, 515A$a$, 515B$a$, and 515C$a$ and exit holes 514A$a$, 514B$a$, 514C$a$, and 516$a$ have shapes and sizes maximizing the flow of air, insofar as the structural strength of the rear cover 510 is guaranteed. Their shapes may be a circle, a rectangle, a diamond, a triangle, and a hexagon. Their sizes are preferably set to enable air to flow as efficiently as possible. Their sizes are determined as being small enough not to allow children's fingers to pass therethrough. Usually, the width of the entry and exit holes 513a, 515Aa, 515Ba, 515Ca, 514Aa, 514Ba, 514Ca, and 516a satisfying the above conditions is about 1-8 mm. In the fifth embodiment, the first exit portions 514A, 514B, and 514C are perpendicular to the rear plane 511 of the rear cover 510, and thus the structural strength of the rear cover 510 increases. The partition wall 520 is formed on the inner surface of the rear cover 510 between the first exit portions 514A, 514B, and 514C and the second entry portions 515A, 515B, and 515C to separate the inner space of the case into the upper and lower spaces so that it guides air to flow out through the first exit portions 514A, 514B, and 514C. The partition wall 520 may be continuously formed throughout the inner surface of the rear plane 511 in a lengthwise direction but is not restricted thereto. In particular, when a certain part contained in the cover has a large size in a vertical direction, the partition wall 520 maybe lowered or discontinued at its portion corresponding to the certain part to accommodate the certain circuit part. That is, the dimensions of the partition wall 520 may vary in the lengthwise direction. In addition, the partition wall 520 may be formed in a straight line in the lengthwise direction but may be formed to go round such a large part as describe above. In other words, the partition wall 520 may be folded or curved. Usually, it is preferable that the spaces separated by the partition wall 520 do not communicate with each other. Accordingly, it is preferable that the partition wall 520 is in close contact with circuit boards 4 through 7 and electronic parts installed on the circuit boards 4 through 7 to prevent air from mixing on opposite sides of partition 520.

Figure 10:
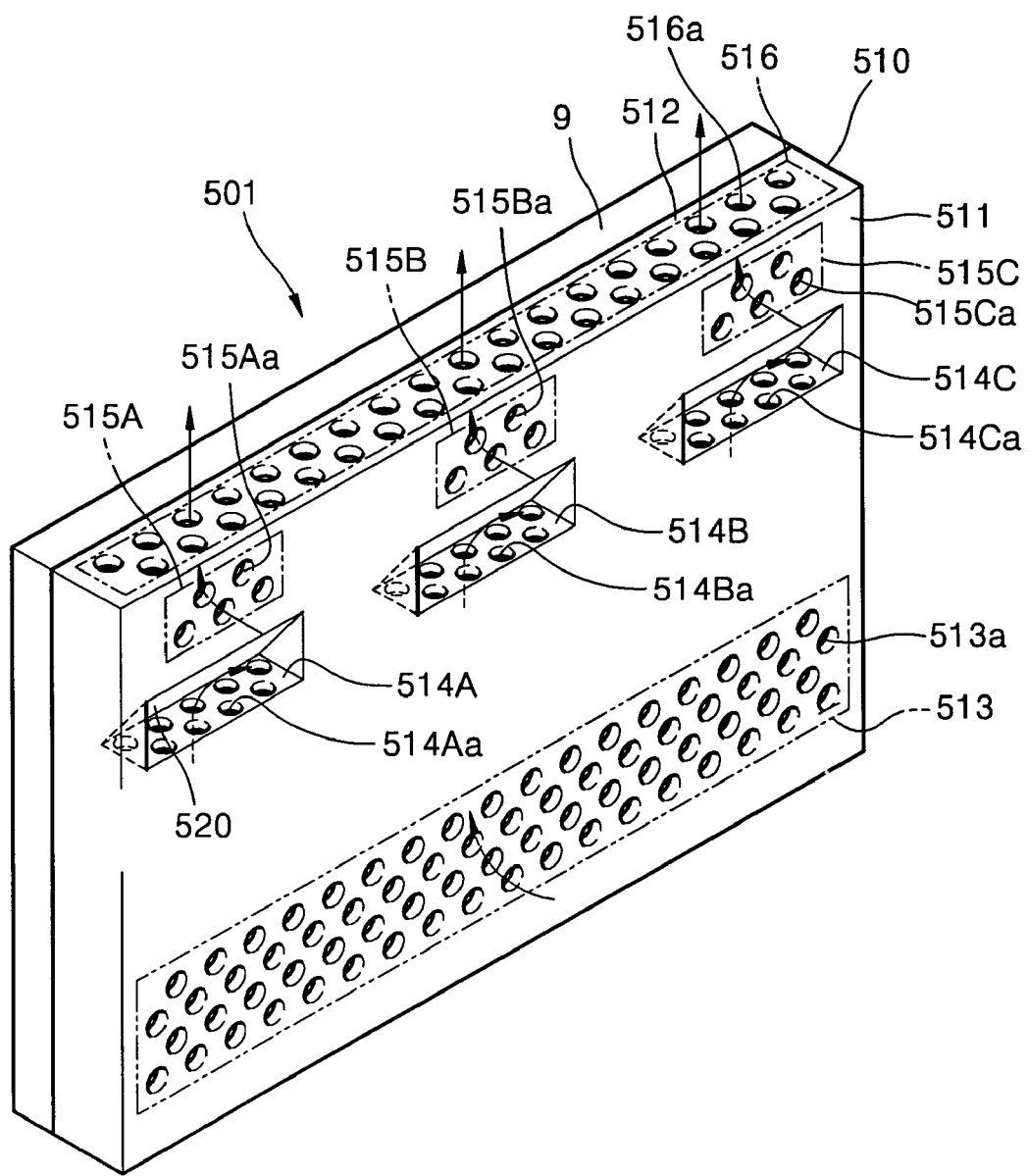
FIG. 10 is a perspective view of the display apparatus illustrated in FIG. 9 after being assembled and illustrates the direction of an air flow.

Inflow and outflow of air through the entry portions 513, 515A, 515B, and 515C and the exit portions 514A, 514B, 514C, and 516 of the case will be described with reference to the arrows in FIG. 10. As illustrated in FIG. 10, air flows in through the first entry portion 513, absorbs heat from electronic parts in the lower space, and is guided by the partition wall 520 to flow out through the first exit portions 514A, 514B, and 514C. Air flowing in through the second entry portions 515A, 515B, and 515C absorbs heat from electronic parts in the upper space and flows out through the second exit portion 516.

The above described air flow can be accomplished due to the effect of natural convection. In natural convection, air flows in and out due to heat generated from the electronic parts. Hot air rises with respect to cool ambient air within the display apparatus 501. In other words, air having absorbed heat from the electronic parts expands and becomes light, and thus goes up and naturally flows out through the exit portions 514A, 514B, 514C, and 516 formed above the entry portions 513, 515A, 515B, and 515C. Then, external air flows in through the entry portions 513, 515A, 515B, and 515C to occupy the space previously filled in by the discharged air.

In the meantime, in order to make air more efficiently flow in and out, a fan may be installed to assist natural convection. In this case, it is preferable to blow an air current in the same direction as a natural air flow. A fan may be installed in some of the spaces separated by the partition wall. Although a fan maybe used in display apparatus 501, the necessity of a fan in display apparatus 501 is diminished due to the improved design of rear cover 510. Since display apparatus 501 and the rear cover 510 dissipates heat better and keeps electronic parts cooler than the display apparatus 1 in FIG. 1, the use of a fan in the display apparatus 501 is less critical than for display apparatus 1 of FIG. 1.

In particular, in the case where a display panel 3 illustrated in FIG. 9 is a high-resolution PDP, it is preferable to separate a screen into an upper portion and a lower portion and to separately drive the upper and lower portions. In this case, it is usual to respectively install image driving integrated circuit chips (directly installed on the rear of the PDP) for controlling the PDP in the upper and lower portions of the PDP. Such an integrated circuit chip radiates a particularly large amount of heat, and thus if air having absorbed heat from a lower integrated circuit chip impinges on the upper integrated circuit chip, the upper chip cannot satisfactorily radiate heat, which badly affects a display apparatus. By separating the inner space of a display apparatus into two spaces using a partition wall and forming entry portions and exit portions in rear planes defining the two spaces, as described in the fifth embodiment, the above problems can be solved.

Figure 11:
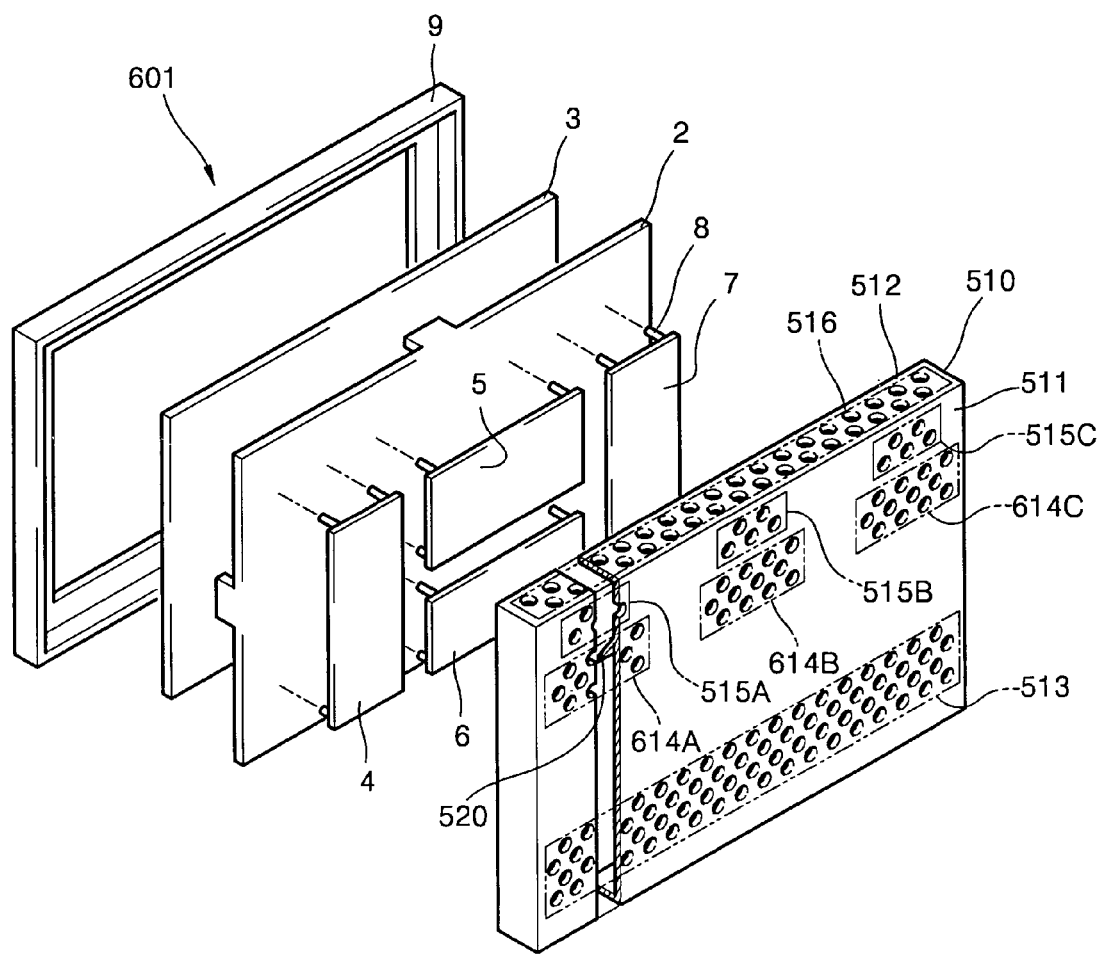
FIG. 11 is an exploded perspective view of a display apparatus including a case for covering electronic parts according to a sixth embodiment of the present invention.

An exploded perspective view of a display apparatus 601 including a case for covering electronic parts according to a sixth embodiment of the present invention is illustrated in FIG. 11. Hereinafter, the features of the sixth embodiment different from the fifth embodiment will be described.

The sixth embodiment is different from the fifth embodiment in that first exit portions 614A, 614B, and 614C are simply formed on the rear plane 511 of the rear cover 510 without being perpendicular to the rear plane 511. When the first exit portions are perpendicular to the rear plane 511 of the rear cover 510, as described in the fifth embodiment, air in the lower space meets the first exit portions before being guided by the partition wall 520, and the air flow gets interrupted by the ribs between holes. Consequently, air is not efficiently discharged, and thus the temperature of the upper portion in the lower space increases. However, if the first exit portions 614A, 614B, and 614C are simply formed on the rear plane 511 of the rear cover 510, as in the sixth embodiment, air in the lower space is guided first by the partition wall 520 and then flows out through the first exit portions 614A, 614B, and 614C, thereby allowing the air to flow out more efficiently than in the fifth embodiment. The direction of an air flow in the sixth embodiment is the same as that in the fifth embodiment.

Figure 12:
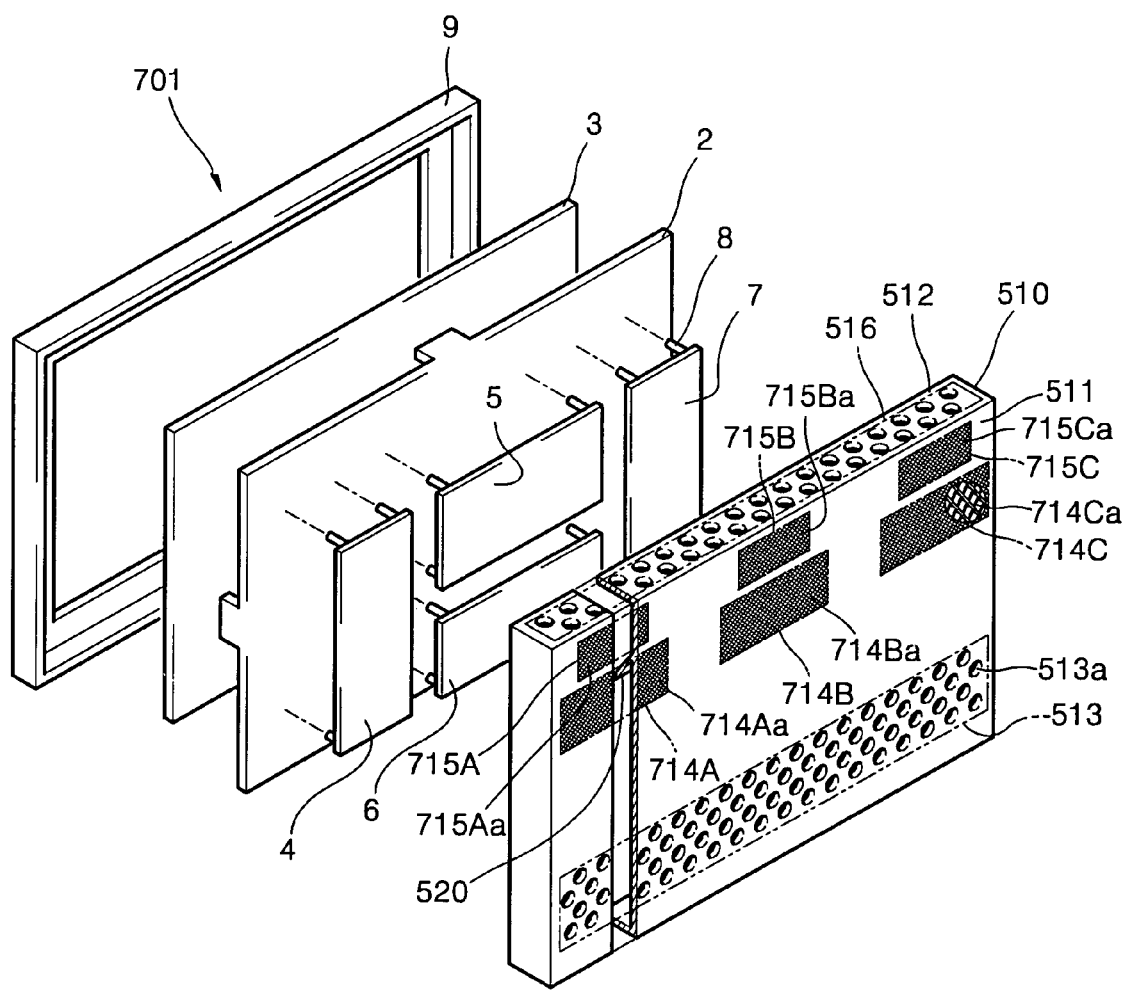
FIG. 12 is an exploded perspective view of a display apparatus including a case for covering electronic parts according to a seventh embodiment of the present invention.

An exploded perspective view of a display apparatus 701 including a case for covering electronic parts according to a seventh embodiment of the present invention is illustrated in FIG. 12. Hereinafter, the features of the seventh embodiment different from the sixth embodiment will be described.

The seventh embodiment is different from the sixth embodiment in that exit holes 714Aa, 714Ba, and 714Ca formed in first exit portions 714A, 714B, and 714C and entry holes 715Aa, 715Ba, and 715Ca formed in second entry portions 715A, 715B, and 715C are defined by a mesh. In the sixth embodiment, the shape of exit and entry holes is a circle. However, in the seventh embodiment, a large opening is formed in each of the first exit portions 714A, 714B, and 714C and the second entry portions 715A, 715B, and 715C, and then a separate mesh material is attached to the opening, or a mesh pattern is formed in the rear cover 510. Holes in the mesh serve as exit or entry holes. Due to the exit holes 714Aa, 714Ba, and 714Ca formed in the first exit portions 714A, 714B, and 714C and the entry holes 715Aa, 715Ba, and 715Ca formed in the second entry portions 715A, 715B, and 715C, an opening ratio can be increased to be, for example, more than 80%. Accordingly, flow resistance of air flowing through the first exit portions 714A, 714B, and 714C and the second entry portions 715A, 715B, and 715C can be minimized. The first entry portion 513 and the second exit portion 516 may be formed in a mesh pattern. The direction of an air flow in the seventh embodiment is the same as that in the fifth embodiment.

Figures 13A, 13B:
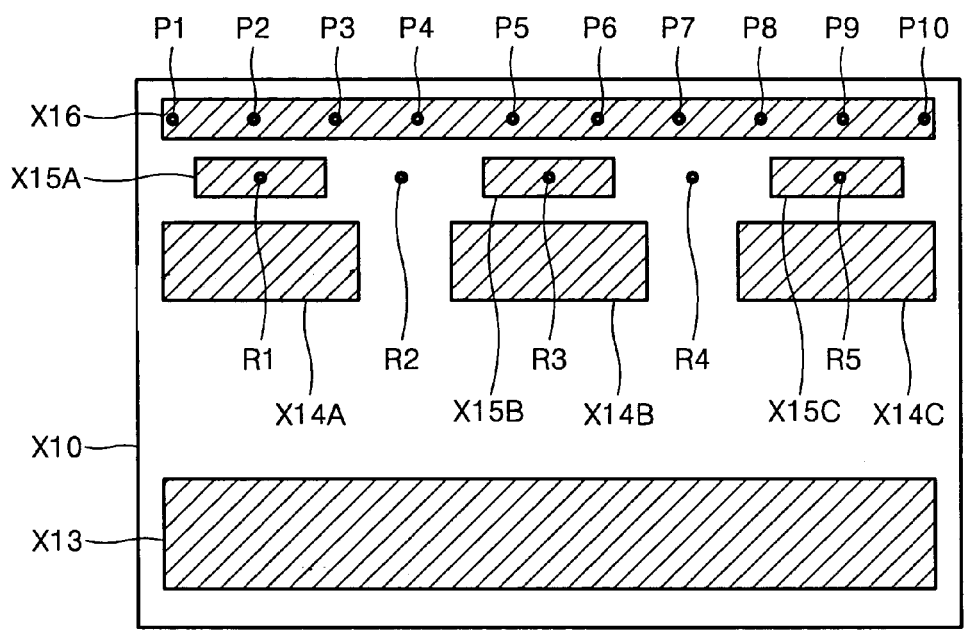
FIG. 13A is a rear view of a case for covering electronic parts according to the present invention and illustrates measuring points in a temperature measuring experiment.
FIG. 13B is a table showing the empirical results of temperature measurements at points P1 through P10 illustrated in FIG. 13A.

FIG. 13A is a rear view of a case for covering electronic parts according to the present invention and illustrates measuring points in a temperature measuring experiment used to empirically verify the increased cooling brought on by the designs for the rear cover. A reference character X10 denotes a rear cover. A reference character X13 denotes a first entry portion. Reference characters X14A, X14B, and X14C denote first exit portions. Reference characters X15A, X15B, and X15C denote second entry portions. A reference character X16 denotes a second exit portion. The detailed descriptions of each member are the same as described above. In this experiment, the rear cover X10 was made of aluminum, and a 42-inch PDP was used as a display panel. The PDP was set to display white color where a maximum amount of heat was generated. A voltage of 220 V was used, and an electronic power was 380 W. The temperature of ambient air was about 26° C. The temperature measurements were performed for 1) the case illustrated in FIG. 1, 2) the case according to the fifth embodiment of the present invention as illustrated in FIG. 9, 3) the case according to the sixth embodiment of the present invention as illustrated in FIG. 11, and 4) the case according to the seventh embodiment of the present invention as illustrated in FIG. 12.

FIG. 13B illustrates the empirical results of temperature measurements at measuring points P1 through P10 and FIG. 13C illustrates the empirical results of temperature measurements at measuring points R1 through R5. As illustrated in FIG. 13B, the case according to the fifth embodiment has similar results to the FIG. 1 case as a whole, but has about a 10° C. lower temperature than the FIG. 1 case at the measuring points P4 and P6 in the central portion. The case according to the sixth embodiment has a slightly higher temperature than the FIG. 1 case at the measuring points P1, P2, and P10 in the left and right end portions but has a lower temperature than the FIG. 1 case at the measuring points P3, P4, P5, P6, and P7 in the central portion, and particularly, has about a 10° C. lower temperature than the FIG. 1 case at the measuring points P4, P5, and P6. The case according to the seventh embodiment has a lower temperature than the FIG. 1 case at every measuring point except for the measuring point P10 and particularly has a lower temperature even than the case according to the sixth embodiment at the measuring points P3, P4, P5, P6, and P7 in the central portion.

The results illustrated in FIG. 13C are similar to those illustrated in FIG. 13B. The cases according to the fifth and sixth embodiments have similar temperature to the FIG. 1 case at measuring points R1 and R5 in the left and right end portions, respectively, but have about a 1 through 6° C. lower temperature than the FIG. 1 case at measuring points R2, R3, and R4 in the central portion. The difference in temperature between the case according to the seventh embodiment and the FIG. 1 case is most promising because the case according to the seventh embodiment has about a 4 through 9° C. lower temperature than the FIG. 1 case at the measuring points R2, R3, and R4 in the central portion.

As illustrated in FIGS. 13B and 13C, the rear case in the preferred embodiments of the present invention are kept at a lower temperature than the FIG. 1 case. In particular, the case according to the seventh embodiment, as illustrated in FIG. 12 measured the best, as temperatures, as a whole, were cooler for the seventh embodiment than for any other case tested. As described above, when a case for covering electronic parts according to the present invention is used, the temperature of a rear cover is remarkably decreased, and thus malfunction of the electronic parts (for example, a display panel) can be prevented, and users are protected from being injured by the hot case. In particular, when considering that the central portion of the case is often touched accidentally by a user, a case for covering electronic parts according to the present invention is advantageous in that the temperature of the central portion of the case is remarkably lower than the FIG. 1 case.

Figure 14:
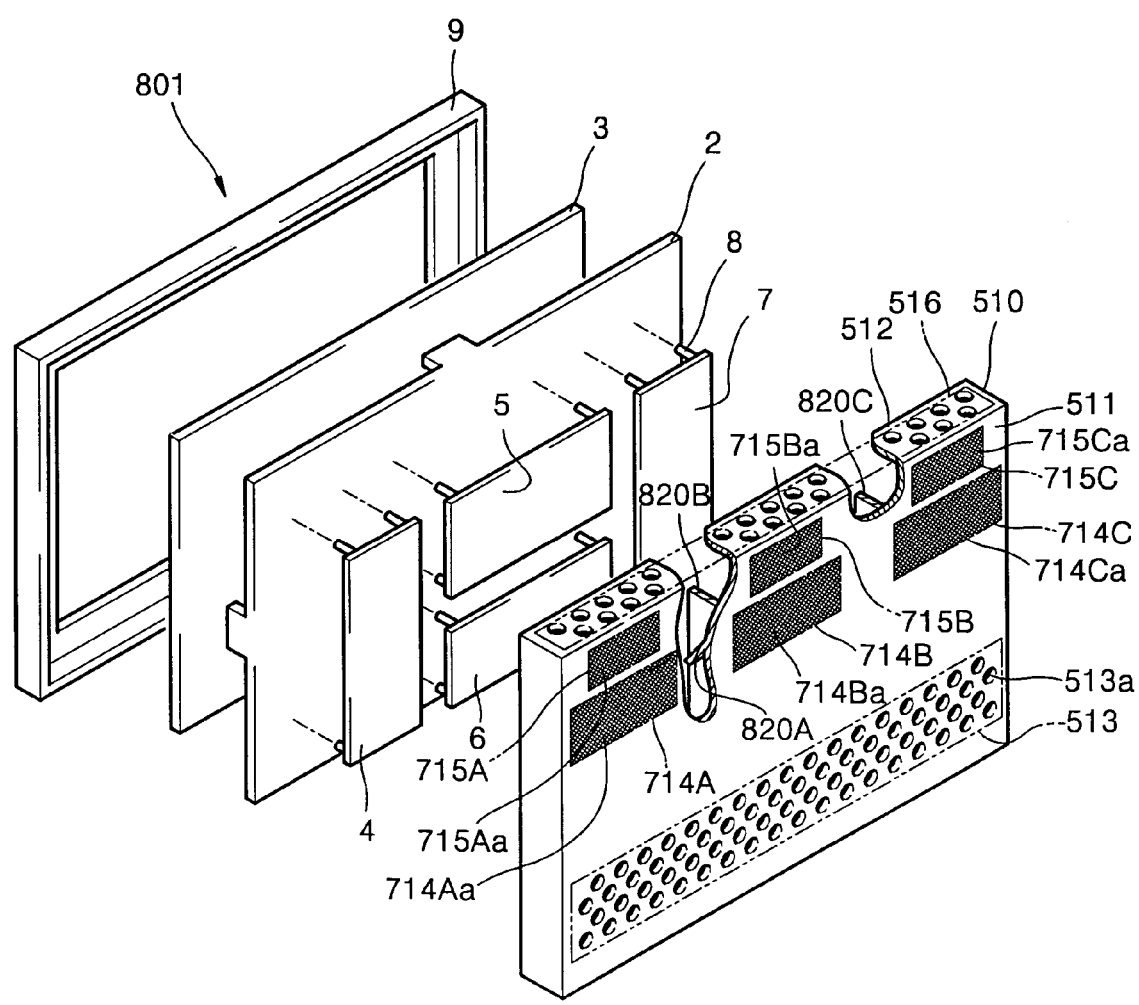
FIG. 14 is an exploded perspective view of a display apparatus including a case for covering electronic parts according to an eighth embodiment of the present invention.

An exploded perspective view of a display apparatus 801 including a case for covering electronic parts according to an eighth embodiment of the present invention is illustrated in FIG. 14. The eighth embodiment is a combination of the second embodiment and the seventh embodiment. Hereinafter, only the features of the eighth embodiment resulting from the combination of the second and seventh embodiments will be described.

A horizontal partition wall 820A is formed on the rear plane 511 of the rear cover 510 in the display apparatus 801 to separate an inner space defined by the rear cover 510 into upper and lower spaces. The upper space defined by the horizontal partition wall 820A is divided into three spaces by a left vertical partition wall 820B and a right vertical partition wall 820C. In addition, the horizontal partition wall 820A is inclined to face first exit portions 714A, 714B, and 714C in order to enable air to efficiently flow out. The case having the above-described structure is particularly advantageous when electronic parts generating a lot of heat are installed in any one area of the three upper areas, above partition 820A. This is because an electrical part that generates an enormous amount of heat and disposed in an upper portion of the frame 2 will not compromise the ability of other circuit components in the upper portion of frame 2 because of vertical partitions 820B and 820C. These partitions serve to prevent hot air generated by one circuit component from impinging on another circuit component in the upper part of frame 2.

Figure 15:
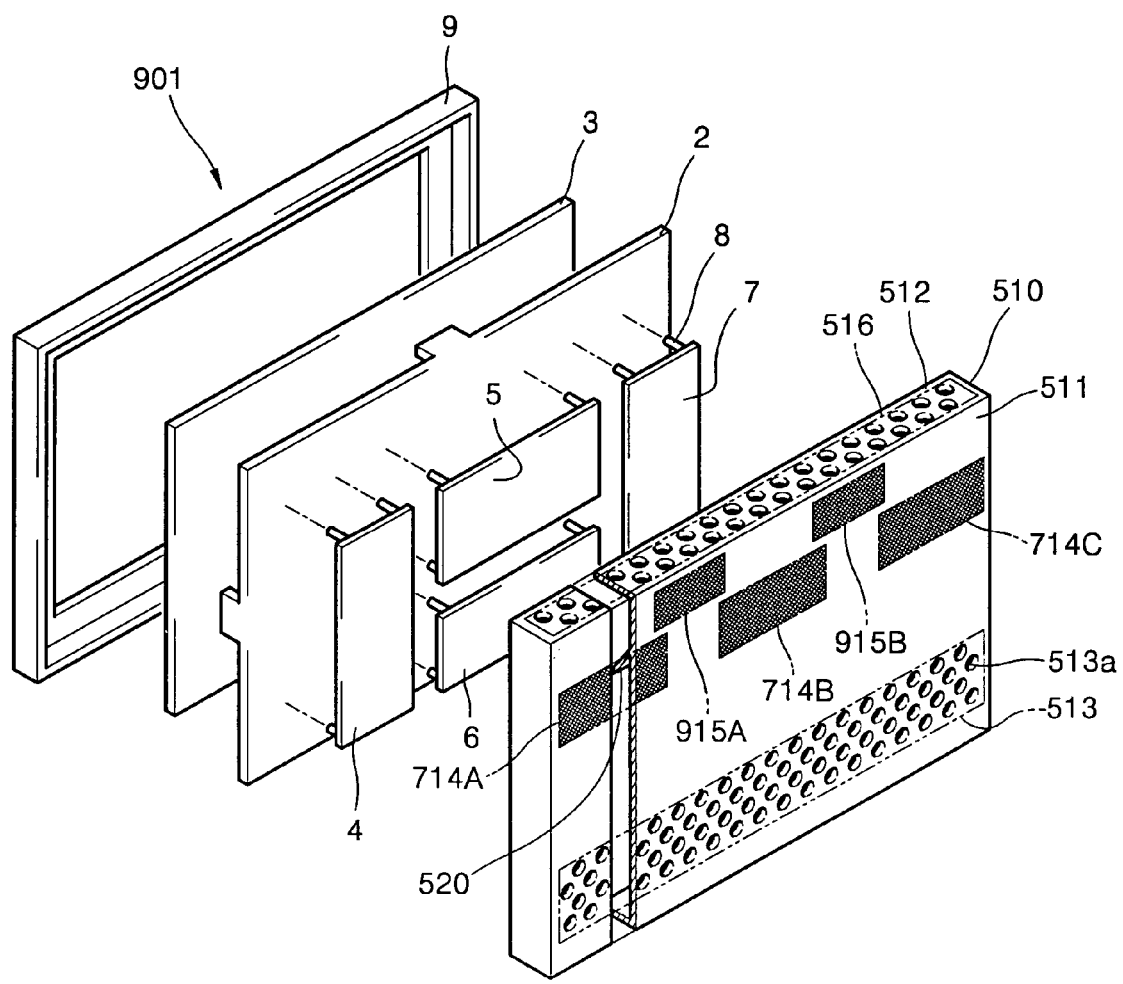
FIG. 15 is an exploded perspective view of a display apparatus including a case for covering electronic parts according to a ninth embodiment of the present invention.

An exploded perspective view of a display apparatus 901 including a case for covering electronic parts according to a ninth embodiment of the present invention is illustrated in FIG. 15. Unlike the seventh embodiment, second entry portions 915A and 915B are disposed to alternate with the first exit portions 714A, 714B, and 714C in the ninth embodiment. In other words, the second entry portion 915A on the left is disposed above a gap between the first exit portions 714A and 714B, and the second entry portion 915B on the right is disposed above a gap between the first exit portions 714B and 714C. Thus, the horizontal location of second entry portions 915A and 915B is staggered with respect to the horizontal locations of exit portions 714A, 714B and 714C so that hot air exiting from first exit portions 714A, 714B and 714C do not enter second entry portions 915A and 915B. This is an important improvement as hot air exiting first exit portions 714A, 714B and 714C rises. Since second entry portions 915A and 915B are not disposed directly above first exit portions 714A, 714B and 714C, hot air expelled from first exit portions 714A, 714B and 714C does not enter second entry portions 915A and 915B. Therefore, second entry portions 915A and 915B draws in air of ambient temperature and not already heated air rising from first exit portions 714A, 714B and 714C. Accordingly, high-temperature air flowing out through the first exit portions 714A, 714B, and 714C is prevented from flowing in through the second entry portions 915A and 915B so that it is reliably guaranteed that electronic parts in the upper space defined by the partition wall 520 are cooled by new external air.

The present invention provides a case for covering electronic parts, which allows heat generated from the electronic parts to be efficiently discharged outside, and a display apparatus including the case. In particular, in a case and a display apparatus according to the first embodiment, the inner space of the case is separated into upper and lower spaces so that electronic parts in an upper portion of the case can be cooled by fresh cool air flowing in from the outside. In a case and a display apparatus according to the second embodiment, the inner space of the case is separated into left and right spaces so that the second embodiment provides an efficient heat protection for electronic parts having a low heat resistance in a case where electronic parts installed in the left and right portions within the case have different thermal characteristics. In a case and a display apparatus according to the third embodiment, a partition wall is formed inclined at an acute angle with respect to a first exit portion so that hot air under the partition wall efficiently flows out through the first exit portion. In a case and a display apparatus according to the fourth and fifth embodiments, the structural strength of a rear cover increases. In a case and a display apparatus according to the sixth embodiment, air in a lower space defined by a partition wall within the case is guided by the partition wall before flowing out through a first exit portion so that the air flows efficiently. In a case and a display apparatus according to the seventh embodiment, exit holes in a first exit portion and entry holes in a second entry portion are defined by a mesh so that an opening ratio is high, thereby allowing air to flow efficiently. A case and a display apparatus according to the eighth embodiment have all of the advantages of the second and seventh embodiments. In a case and a display apparatus according to the ninth embodiment, a first exit portion and a second entry portion are alternately disposed so that hot air having flowed out through the first exit portion is prevented from flowing in through the second entry portion. Accordingly, heat discharge in the upper space is improved.

While this invention has been particularly illustrated and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined by the appended claims.

What is claimed is:

1. A display apparatus, comprising:
a display panel;
a circuit board adapted to drive the display panel;
a frame adapted to support the display panel and the circuit board; and
a case adapted to cover the circuit board, the display panel and the frame, the case comprising at least one partition wall dividing an inner space of the case into a plurality of sub-inner spaces, and dividing a rear plane of the case into a plurality of sub-rear planes, wherein at least one entry portion through which air flows in, and at least one exit portion through which air flows out, are arranged in each of the sub-rear planes of the case, wherein the partition wall at least partially separates the inner space into an upper space and a lower space, the at least one partition wall being an indentation in the case, the indentation being an indent in a rear, exterior side of the case, the indentation being perforated by a plurality of apertures adapted to let hot air out from an inside of the display apparatus.

2. A display apparatus, comprising:
a display panel;
a circuit board adapted to drive the display panel;
a frame adapted to support the display panel and the circuit board; and
a case adapted to cover the circuit board, the display panel and the frame, the case comprising at least one partition wall dividing an inner space of the case into a plurality of sub-inner spaces, and dividing a rear plane of the case into a plurality of sub-rear planes, wherein at least one entry portion through which air flows in, and at least one exit portion through which air flows out, are arranged in each of the sub-rear planes of the case, wherein the partition wall at least partially separates the inner space into an upper space and a lower space, the at least one partition wall being an indentation in the case, the indentation being an indent in a rear, exterior side of the case, the indentation being perforated by a plurality of apertures adapted to let hot air out from an inside of the display apparatus, the indentation also serving as the at least one partition that is adapted to prevent substantially all hot air generated in said lower space from flowing into said upper space.

* * * * *